(12) United States Patent
Kyono et al.

(10) Patent No.: US 7,576,351 B2
(45) Date of Patent: Aug. 18, 2009

(54) NITRIDE SEMICONDUCTOR LIGHT GENERATING DEVICE

(75) Inventors: Takashi Kyono, Itami (JP); Hideki Hirayama, Wako (JP)

(73) Assignees: Sumitomo Electric Industries, Ltd., Osaka (JP); Riken, Saitama (JP)

( * ) Notice: Subject to any disclaimer, the term of this patent is extended or adjusted under 35 U.S.C. 154(b) by 275 days.

(21) Appl. No.: 11/698,093

(22) Filed: Jan. 26, 2007

(65) Prior Publication Data

US 2007/0170459 A1    Jul. 26, 2007

(30) Foreign Application Priority Data

Jan. 26, 2006    (JP) ............... P2006-018159

(51) Int. Cl.
*H01L 29/12* (2006.01)
(52) U.S. Cl. .................. 257/11; 257/189; 257/200; 257/E21.097; 257/E33.034
(58) Field of Classification Search ............. None
See application file for complete search history.

(56) References Cited

U.S. PATENT DOCUMENTS

| 2002/0094003 A1 | 7/2002 | Bour et al. | |
| 2007/0217458 A1* | 9/2007 | Kitano et al. | 372/43.01 |

FOREIGN PATENT DOCUMENTS

| EP | 1 128 446 A2 | 8/2001 |
| EP | 1 536 486 A1 | 6/2005 |
| EP | 1 772 910 A1 | 4/2007 |
| JP | 6-164055 | 6/1994 |
| JP | 10-163566 | 6/1998 |
| JP | 2000-164925 A | 6/2000 |

(Continued)

OTHER PUBLICATIONS

Hirayama, H., et al., "Quaternary InAlGaN-based high-efficiency ultraviolet light-emitting diodes", Journal of Applied Physics, Apr. 2005, pp. 091101-1-091101-19, vol. 97 No. 9, American Institute of Physics (IDS Reference).*

(Continued)

*Primary Examiner*—Evan Pert
*Assistant Examiner*—Scott R Wilson
(74) *Attorney, Agent, or Firm*—McDermott Will & Emery LLP (57) ABSTRACT

A nitride semiconductor light generating device comprises an n-type gallium nitride based semiconductor layer, a quantum well active layer including an $In_{X1}Al_{Y1}Ga_{1-X1-Y1}N$ (1>X1>0, 1>Y1>0) well layer and an $In_{X2}Al_{Y2}Ga_{1-X2-Y2}N$ (1>X2>0, 1>Y2>0) barrier layer, an $In_{X3}Al_{Y3}Ga_{1-X3-Y3}N$ (1>X3>0, 1>Y3>0) layer provided between the quantum well active layer and the n-type gallium nitride based semiconductor layer, and a p-type AlGaN layer having a bandgap energy greater than that of the $In_{X2}Al_{Y2}Ga_{1-X2-Y2}N$ barrier layer. The indium composition X3 is greater than an indium composition X1. The indium composition X3 is greater than an indium composition X2. The aluminum composition Y2 is smaller than an aluminum composition Y3. The aluminum composition Y1 is smaller than an aluminum composition Y3. The oxygen concentration of the quantum well active layer is lower than that of the $In_{X3}Al_{Y3}Ga_{1-X3-Y3}N$ layer. The quantum well active layer is provided between the p-type AlGaN layer and the $In_{X3}Al_{Y3}Ga_{1-X3-Y3}N$ layer.

5 Claims, 9 Drawing Sheets

FOREIGN PATENT DOCUMENTS

| | | |
|---|---|---|
| JP | 2001-111172 | 4/2001 |
| JP | 2005-167099 | 6/2005 |

OTHER PUBLICATIONS

European Search Report issued in European Patent Application No. EP 07 00 1335, mailed Oct. 7.

Hirayama, H., et al., "Quaternary InAlGaN-based high-efficiency ultraviolet light-emitting diodes", Journal of Applied Physics, Apr. 2005, pp. 091101-1-091101-19, vol. 97 No. 9, American Institute of Physics.

Japanese Office Action, w/English translation thereof, issued in Japanese Patent Application No. JP 2006-018159 dated on Oct. 14, 2008.

Japanese Notice of Rejection, w/English translation thereof, issued in Japanese Patent Application No. JP 2006-018159 dated Mar. 24, 2009.

Chinese Office Action, w/English translation thereof, issued in Chinese Patent Application No. CN 200710008167.2 dated Mar. 13, 2009.

\* cited by examiner

NITRIDE SEMICONDUCTOR LIGHT GENERATING DEVICE

BACKGROUND OF THE INVENTION

1. Field of the Invention

The present invention relates to a nitride semiconductor light generating device.

2. Related Background Art

Patent Publication 1 (Japanese Patent Application Laid Open No. 2000-164925) discloses a nitride semiconductor light generating device having a active region of a double heterostructure. The nitride semiconductor light generating device includes an active layer having the oxygen atom concentration of Qa (atoms/cm$^3$) and made of n-type InGaN of a multiple layer structure having primary and secondary layers the indium content of which are different from each other. The active layer is sandwiched by an n-type cladding layer of group III nitride semiconductor of an oxygen atom concentration Qc (atoms/cm$^3$) which is smaller than or equal to Qa, and a p-type cladding layer of group III nitride semiconductor of an oxygen atom concentration Qp (atoms/cm$^3$) which is greater than or equal to Qc and smaller than or equal to Qa.

SUMMARY OF THE INVENTION

In the nitride light generating device of Patent Publication 1, the active layer of the oxygen atom concentration Qa is sandwiched by the n-type cladding layer of the oxygen atom concentration Qc and the p-type cladding layer of the oxygen atom concentration Qp. Patent Publication 1 does not provide any teaching of the active layer including an InAlGaN semiconductor layer.

It is an object to provide a nitride semiconductor light generating device, which has a high carrier injection efficiency, including an active layer having an InAlGaN semiconductor layer.

According to one aspect of the present invention, a nitride semiconductor light generating device comprises: (a) an n-type gallium nitride based semiconductor layer; (b) a quantum well active layer including an $In_{X1}Al_{Y1}Ga_{1-X1-Y1}N$ (1>X1>0, 1>Y1>0) well layer and an $In_{X2}Al_{Y2}Ga_{1-X2-Y2}N$ (1>X2>0, 1>Y2>0) barrier layer; (c) an $In_{X3}Al_{Y3}Ga_{1-X3-Y3}N$ (1>X3>0, 1>Y3>0) layer provided between the quantum well active layer and the n-type gallium nitride based semiconductor layer, an indium composition X3 of the $In_{X3}Al_{Y3}Ga_{1-X3-Y3}N$ layer being greater than an indium composition X1 of the $In_{X1}Al_{Y1}Ga_{1-X1-Y1}N$ well layer, an indium composition X3 of the $In_{X3}Al_{Y3}Ga_{1-X3-Y3}N$ layer being greater than an indium composition X2 of the $In_{X2}Al_{Y2}Ga_{1-X2-Y2}N$ barrier layer, an aluminum composition Y1 of the $In_{X1}Al_{Y1}Ga_{1-X1-Y1}N$ well layer being smaller than an aluminum composition Y3 of the $In_{X3}Al_{Y3}Ga_{1-X3-Y3}N$ layer, an aluminum composition Y2 of the $In_{X2}Al_{Y2}Ga_{1-X2-Y2}N$ barrier layer being smaller than an aluminum composition Y3 of the $In_{X3}Al_{Y3}Ga_{1-X3-Y3}N$ layer, and an oxygen concentration of the quantum well active layer being lower than that of the $In_{X3}Al_{Y3}Ga_{1-X3-Y3}N$ layer; and (d) a p-type AlGaN layer having a bandgap energy greater than that of the $In_{X2}Al_{Y2}Ga_{1-X2-Y2}N$ barrier layer, the quantum well active layer being provided between the p-type AlGaN layer and the $In_{X3}Al_{Y3}Ga_{1-X3-Y3}N$ layer.

In the nitride semiconductor light generating device according to the present invention, it is preferable that an oxygen concentration of the $In_{X3}Al_{Y3}Ga_{1-X3-Y3}N$ layer be greater than or equal to $1 \times 10^{18}$ cm$^{-3}$.

In the nitride semiconductor light generating device according to the present invention, it is preferable that an oxygen concentration of the $In_{X3}Al_{Y3}Ga_{1-X3-Y3}N$ layer be lower than or equal to $1 \times 10^{20}$ cm$^{-3}$.

In the nitride semiconductor light generating device according to the present invention, it is preferable that an oxygen concentration of the quantum well active layer be lower than $1 \times 10^{18}$ cm$^{-3}$.

In the nitride semiconductor light generating device according to the present invention, it is preferable that an oxygen concentration of the quantum well active layer be greater than or equal to $1 \times 10^{16}$ cm$^{-3}$.

The nitride semiconductor light generating device according to the present invention further comprises a group III nitride substrate, and the n-type gallium nitride based semiconductor layer is provided between the $In_{X3}Al_{Y3}Ga_{1-X3-Y3}N$ layer and the group III nitride substrate.

In the nitride semiconductor light generating device according to the present invention, it is preferable that the group III nitride substrate include a gallium nitride substrate.

BRIEF DESCRIPTION OF THE DRAWINGS

The above objects and other objects, features, and advantages of the present invention will be understood easily from the following detailed description of the preferred embodiments of the present invention with reference to the accompanying drawings.

DETAILED DESCRIPTION OF THE PREFERRED EMBODIMENTS

The teachings of the present invention will readily be understood in view of the following detailed description with reference to the accompanying drawings illustrated by way of example. Referring to the accompanying drawings, embodiments of the present invention will be explained. When possible, parts identical to each other will be referred to with symbols identical to each other.

First Embodiment

Figure 1:
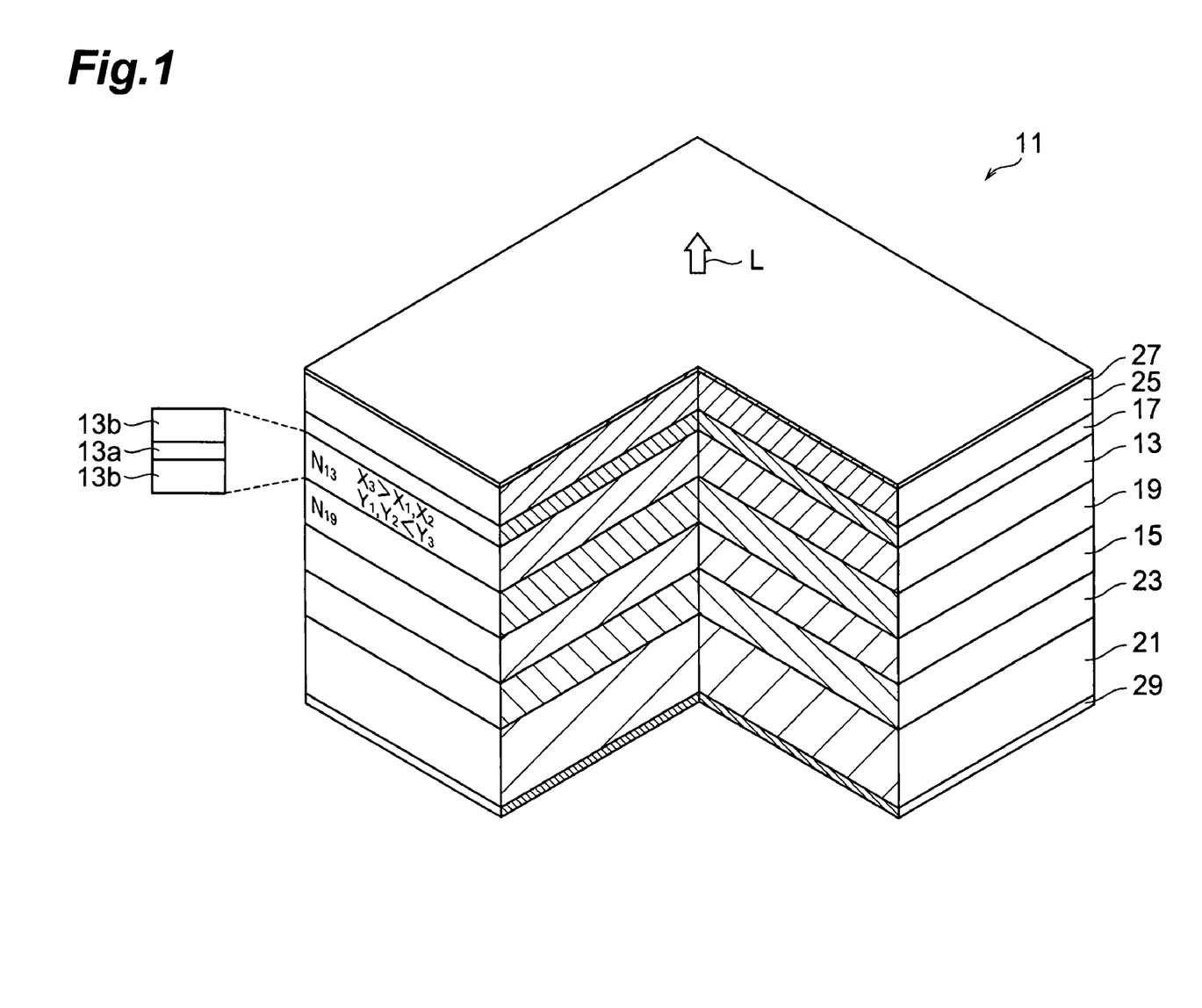
FIG. 1 is a schematic view showing the structure of a nitride light generating device according to a first embodiment of the present invention.

FIG. 1 is a view showing the structure of a nitride semiconductor light generating device. The nitride semiconductor light generating device 11 comprises a quantum well active layer 13, an n-type gallium nitride based semiconductor 15, and a p-type AlGaN semiconductor layer 17. The quantum well active layer 13 includes an $In_{X1}Al_{Y1}Ga_{1-X1-Y1}N$ (1>X1>0, 1>Y1>0) well layer 13a and an $In_{X2}Al_{Y2}Ga_{1-X2-Y2}N$ (1>X2>0, 1>Y2>0) barrier layer 13b. The nitride semiconductor light generating device 11 includes an $In_{X3}Al_{Y3}Ga_{1-X3-Y3}N$ (1>X3,>0, 1>Y3>0) layer 19. The $In_{X3}Al_{Y3}$ $Ga_{1-X3-Y3}N$ (1>X3>0, 1>Y3>0) layer 19 is provided between the quantum well active layer 13 and the n-type gallium nitride based semiconductor layer 15. The p-type AlGaN layer 17 has the bandgap energy $E_{CP}$ greater than the bandgap energy $E_B$ of the $In_{X2}Al_{Y2}Ga_{1-X2-Y2}N$ barrier layer.13b. The quantum well active layer 13 is provided between the p-type AlGaN layer 17 and the $In_{X3}Al_{Y3}Ga_{1-X3-Y3}N$ layer 19. The indium composition X3 of the $In_{X3}Al_{Y3}Ga_{1-X3-Y3}N$ layer 19 is greater than the indium composition X1 of the $In_{X1}Al_{Y1}Ga_{1-X1-Y1}N$ well layer 13a. The indium composition X3 of the $In_{X3}Al_{Y3}Ga_{1-X3-Y3}N$ layer 19 is greater than the indium composition X2 of the $In_{X2}Al_{Y2}Ga_{1-X2-Y2}N$ barrier layer 13b. The aluminum composition Y1 of the $In_{X1}Al_{Y1}Ga_{1-X1-Y1}N$ well layer 13a is smaller than the aluminum composition Y3 of the $In_{X3}Al_{Y3}Ga_{1-X3-Y3}N$ layer 19. The aluminum composition Y2 of the $In_{X2}Al_{Y2}Ga_{1-X2-Y2}N$ barrier 13b is smaller than the aluminum composition Y3 of the $In_{X3}Al_{Y3}Ga_{1-X3-Y3}N$ layer 19. The oxygen concentration of the quantum well active layer 13 is lower than that of the $In_{X3}Al_{Y3}Ga_{1-X3-Y3}N$ layer 19.

In the nitride semiconductor light generating device 11, the $In_{X3}Al_{Y3}Ga_{1-X3-Y3}N$ layer 19 has an excellent buffering ability because the indium composition X3 of the $In_{X3}Al_{Y3}Ga_{1-X3-Y3}N$ layer 19 is greater than the indium composition X1 of the $In_{X1}Al_{Y1}Ga_{1-X1-Y1}N$ well layer 13a and the indium composition X3 of the $In_{X3}Al_{Y3}Ga_{1-X3-Y3}N$ layer 19 is greater than the indium composition X2 of the $In_{X2}Al_{Y2}Ga_{1-X2-Y2}N$ barrier layer 13b. Therefore, the optical performances and crystalline quality of the light generating quantum well layer 13 are improved.

Since the indium composition X1 of the $In_{X1}Al_{Y1}Ga_{1-X1-Y1}N$ well layer 13a is smaller than the indium composition X3 of the $In_{X3}Al_{Y3}Ga_{1-X3-Y3}N$ layer 19 and the indium composition X2 of the $In_{X2}Al_{Y2}Ga_{1-X2-Y2}N$ barrier layer 13b is smaller than the indium composition X3 of the $In_{X3}Al_{Y3}Ga_{1-X3-Y3}N$ layer 19, the aluminum composition Y1 of the $In_{X1}Al_{Y1}Ga_{1-X1-Y1}N$ well layer 13a is decreased as compared to the aluminum composition Y3 of the $In_{X3}Al_{Y3}Ga_{1-X3-Y3}N$ layer 19, and the aluminum composition Y2 of the $In_{X2}Al_{Y2}Ga_{1-X2-Y2}N$ barrier 13b is decreased as compared to the aluminum composition Y3 of the $In_{X3}Al_{Y3}Ga_{1-X3-Y3}N$ layer 19, thereby providing the $In_{X1}Al_{Y1}Ga_{1-X1-Y1}N$ well layer 13a and the $In_{X2}Al_{Y2}Ga_{1-X2-Y2}N$ well layer 13b each having the desired value of bandgap energy.

Furthermore, since the aluminum composition Y1 of the $In_{X1}Al_{Y1}Ga_{1-X1-Y1}N$ well layer 13a and the aluminum composition Y2 of the $In_{X2}Al_{Y2}Ga_{1-X2-Y2}N$ barrier 13b are smaller than the aluminum composition Y3 of the $In_{X3}Al_{Y3}Ga_{1-X3-Y3}N$ layer 19, the oxygen concentration $N_{13}$ of the quantum well active layer 13 is lower than the oxygen concentration $N_{19}$ of the $In_{X3}Al_{Y3}Ga_{1-X3-Y3}N$ layer 19. Since the concentration of oxygen acting as n-type dopant is decreased in the quantum well active layer 13, electron leakage to the p-type AlGaN layer is reduced thereby enhancing the light emitting efficiency.

In the nitride semiconductor light generating device 11, the quantum well active layer 13 is provided to generate light in an ultraviolet wavelength region. Preferably, the peak wavelength of the light is in the range of 260 nanometers to 360 nanometers. Since the quantum well active layer 13 has a quantum well structure, this quantum well structure is constituted to generate light of a desired wavelength in the ultraviolet wavelength region by adjusting bandgap energy widths and/or compositions of the well layer and barrier layer.

The nitride semiconductor light generating device 11 further comprises a group III nitride substrate 21. The n-type gallium nitride based semiconductor 15 is provided between the $In_{X3}Al_{Y3}Ga_{1-X3-Y3}N$ layer 19 and the group III nitride substrate 21. By using group III nitride substrate 21, gallium nitride based semiconductor having an excellent crystalline quality is grown thereon. Preferably, the group III nitride substrate 21 is an n-type gallium nitride substrate. Accordingly, the nitride semiconductor light generating device 11 is provided with a substrate having a low threading dislocation density.

The nitride semiconductor light generating device 11 further comprises a buffer layer 23 provided on the group III nitride substrate 21. The buffer layer 23 is made of n-type gallium nitride based semiconductor. This n-type gallium nitride based semiconductor is, for example, n-type GaN or n-type AlGaN.

The nitride semiconductor light generating device 11 further comprises a p-type gallium nitride based semiconductor layer 25 provided the p-type AlGaN layer 17. The p-type gallium nitride based semiconductor layer 25 has a bandgap energy smaller than that of the p-type AlGaN layer 17, and is made of, for example, p-type GaN or p-type AlGaN.

The nitride semiconductor light generating device 11 further comprises a first electrode 27 provided the p-type gallium nitride based semiconductor layer 25, and a second electrode 29 provided on the back side of the group III nitride substrate 21. The first electrode 27 works as an anode electrode and the second electrode works as a cathode electrode. When voltage is applied across the anode electrode and the cathode electrode, then carries are injected into the quantum well active layer 13 to generate light "L" in response to the recombination of the carriers.

In the nitride semiconductor light generating device 11, it is preferable that the oxygen concentration $N_{19}$ of the $In_{X3}Al_{Y3}Ga_{1-X3-Y3}N$ layer 19 be greater than or equal to $1 \times 10^{18}$ $cm^{-3}$. In order to lower the oxygen concentration below $1 \times 10^{18}$ $cm^{-3}$, it is necessary to raise the growth temperature, and this causes the decrease of the indium composition and the resulting deterioration of the buffering ability of the $In_{X3}Al_{Y3}Ga_{1-X3-Y3}N$ layer 19.

In the nitride semiconductor light generating device 11, it is preferable that the oxygen concentration $N_{19}$ of the $In_{X3}Al_{Y3}Ga_{1-X3-Y3}N$ layer 19 be smaller than or equal to $1 \times 10^{20}$ $cm^{-3}$. If the oxygen concentration is greater than $1 \times 10^{20}$ $cm^{-3}$, the crystalline quality of the $In_{X3}Al_{Y3}Ga_{1-X3-Y3}N$ layer is deteriorated and this lowering affects the crystalline quality of the quantum well active layer 13.

In the nitride semiconductor light generating device 11, it is preferable that that the oxygen concentration $N_{13}$ of the quantum well active layer 13 be smaller than $1 \times 10^{18}$ $cm^{-3}$. If the oxygen concentration of the quantum well active layer 13 is greater than or equal to $1 \times 10^{18}$ $cm^{-3}$, this affects the crystalline quality of the quantum well active layer 13 and also causes the increases of the electron leakage to the p-type AlGaN layer.

In the nitride semiconductor light generating device 11, it is preferable that the oxygen concentration $N_{13}$ of the quantum well active layer 13 be greater than or equal to $1 \times 10^{16}$ $cm^{-3}$. If the oxygen concentration of the quantum well active layer 13 is lower than $1 \times 10^{16}$ $cm^{-3}$, the indium concentration is decreased and light generation efficiency is deteriorated.

Further, in the nitride semiconductor light generating device 11, it is preferable that the oxygen concentration of the well layer 13a be lower than $1 \times 10^{18}$ $cm^{-3}$. If the well layer 13a has an oxygen concentration greater than or equal to $1 \times 10^{18}$ $cm^{-3}$, this affects the crystalline quality of the quantum well layer 13a and also causes the increase of the electron leakage to the p-type AlGaN layer.

In the nitride semiconductor light generating device 11, it is preferable that that the oxygen concentration of the well layer 13a be greater than or equal to $1\times10^{16}$ cm$^{-3}$. The growth temperature has to be raised so that the oxygen concentration decreased below $1\times10^{16}$ cm$^{-3}$, and the indium concentration is lowered, thereby decreasing the light generation efficiency.

Furthermore, in the nitride semiconductor light generating device 11, it is preferable that the oxygen concentration of the barrier layer 13b be lower than $1\times10^{18}$ cm$^{-3}$. If the barrier layer 13b has an oxygen concentration greater than or equal to $1\times10_{18}$ cm$^{-3}$, this affects the crystalline quality of the barrier layer 13b and also causes the increase of the electron leakage to the p-type AlGaN layer.

In the nitride semiconductor light generating device 11, it is preferable that that the oxygen concentration of the barrier layer 13b be greater than or equal to $1\times10^{16}$ cm$^{-3}$. The growth temperature has to be raised so that the oxygen concentration is decreased lower than $1\times10^{16}$ cm$^{-3}$, and the indium concentration of the barrier layer 13b is lowered, thereby decreasing the light generation efficiency.

Second Embodiment

With reference to Parts (A) and (B) of FIG. 2 and Parts (A) and (B) of FIG. 3, a method of fabricating a nitride semiconductor light generating device will be explained. A gallium nitride wafer 31 is prepared. The gallium nitride wafer 31 has an electrical conductivity and is made of n-type GaN. The gallium nitride wafer 31 is set in an organo-metallic vapor phase epitaxy furnace, and a thermal cleaning of the gallium nitride wafer 31 is performed. For this thermal cleaning, the temperature of the organo-metallic vapor phase epitaxy furnace is set at the temperature of 1050 degrees Celsius. Gas containing ammonia and hydrogen (NH$_3$+H$_2$) is supplied to the organo-metallic vapor phase epitaxy furnace to perform the thermal cleaning for ten minutes, for example.

Figure 2:
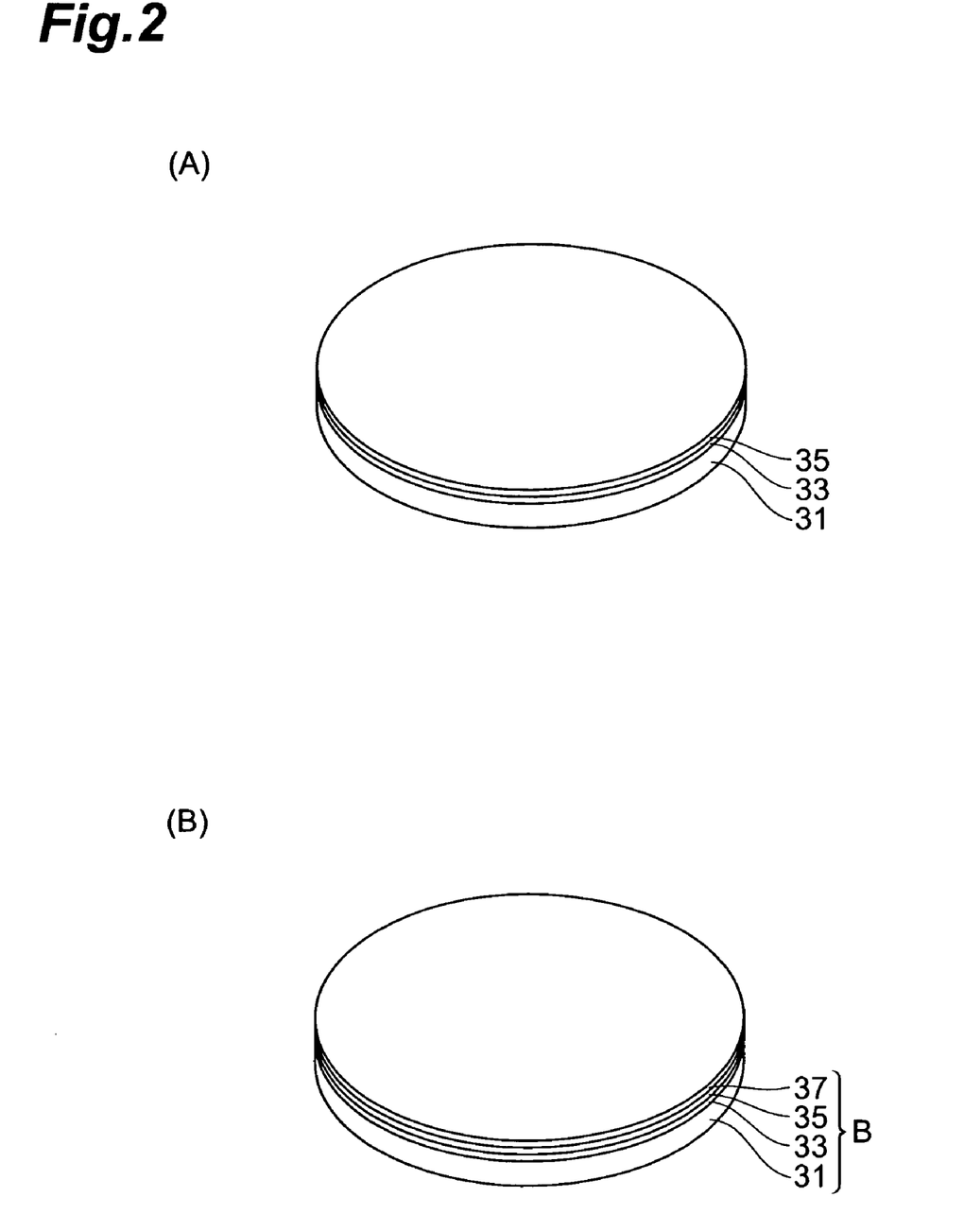
FIG. 2 is a view showing fabrication steps for structures 1 and 2.

Thereafter, as shown in Part (A) of FIG. 2, an n-type GaN film 33 is grown on the GaN wafer 31 using the organo-metallic vapor phase epitaxy furnace. This growth is performed at the temperature of 1150 degrees Celsius, for example, and the thickness of the n-type GaN film 33 is two micrometers, for example. Then, an n-type AlGaN film 35 is grown on the n-type GaN film 33. This growth is performed at the temperature of, for example, 1080 degrees Celsius. The composition of the n-type AlGaN film 35 is, for example, Al$_{0.18}$Ga$_{0.82}$N, and the thickness of the n-type AlGaN film 35 is, for example, 30 nanometers.

As shown in Part (B) of FIG. 2, an n-type InAlGaN buffer layer 37 (hereinafter referred to as the In$_{X3}$Al$_{Y3}$Ga$_{1-X3-Y3}$N (1>X3>0, 1>Y3>0) as with the first embodiment) is grown on the n-type AlGaN film 35. The growth is performed at the temperature of 780 degrees Celsius, for example. The composition of the n-type InAlGaN buffer layer 37 is, for example, In$_{0.05}$Al$_{0.24}$Ga$_{0.71}$N, and its thickness is, for example, 35 nanometers. These steps provide an epitaxial wafer "B."

Next, with reference to Parts (A) and (B) of FIG. 3, the formation of a quantum well active region will be explained. First, a quantum well active region 39 for structure 1 is grown on the epitaxial wafer "B." The quantum well active region 39 includes a well layer 39a and a barrier layer 39b. The well layer 39a is an In$_{U1}$Al$_{V1}$Ga$_{1-U1-V1}$N (1>U1>0, 1>V1>0). The barrier layer 39b is an In$_{U2}$Al$_{V2}$Ga$_{1-U2-V2}$N (1>U2>0, 1>V2>0). The formation temperature of the quantum well active region 39 is substantially the same as the growth temperature of the InAlGaN buffering layer 37. In the present embodiment, the growth of the quantum well active region 39 is performed at the temperature of 780 degrees Celsius. In one example, the composition of the well layer 39a is In$_{0.06}$Al$_{0.19}$Ga$_{0.75}$N and the composition of the barrier layer 39b is In$_{0.05}$Al$_{0.24}$Ga$_{0.71}$N. The thickness of the In$_{0.06}$Al$_{0.19}$Ga$_{0.75}$N well layer is 2.5 nanometers and the thickness of the In$_{0.05}$Al$_{0.24}$Ga$_{0.71}$N barrier layer is 15 nanometers.

Figure 3:
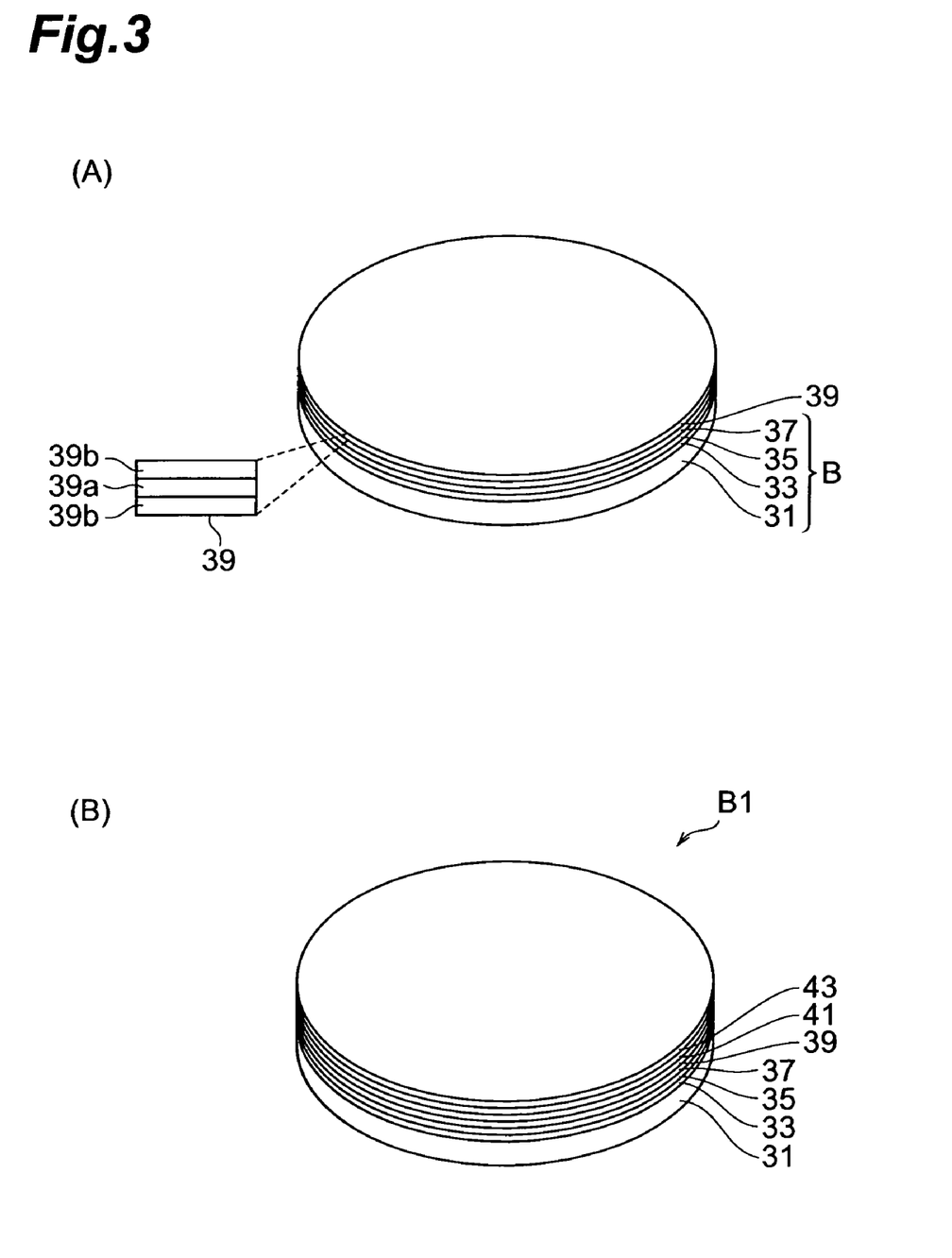
FIG. 3 is a view showing fabrication steps for structure 1.

As shown in Part (B) of FIG. 3, a p-type AlGaN film 41 for blocking electrons is formed using the organo-metallic vapor phase epitaxy furnace. This growth is performed at the temperature of 1030 degrees Celsius, for example. The composition of the p-type AlGaN film 41 is, for example, Al$_{0.27}$Ga$_{0.73}$N and the thickness of the p-type AlGaN film 41 is, for example, 25 nanometers. Then, a p-type AlGaN film 43 for forming an excellent ohmic contact is grown using the organo-metallic vapor phase epitaxy furnace. This growth is performed at the temperature of 1030 degrees Celsius. The composition of the p-type AlGaN film 43 is, for example, Al$_{0.18}$Ga$_{0.82}$N and the thickness of the p-type AlGaN film 43 is, for example, 60 nanometers. These steps provide an epitaxial wafer "B1."

Figure 4:
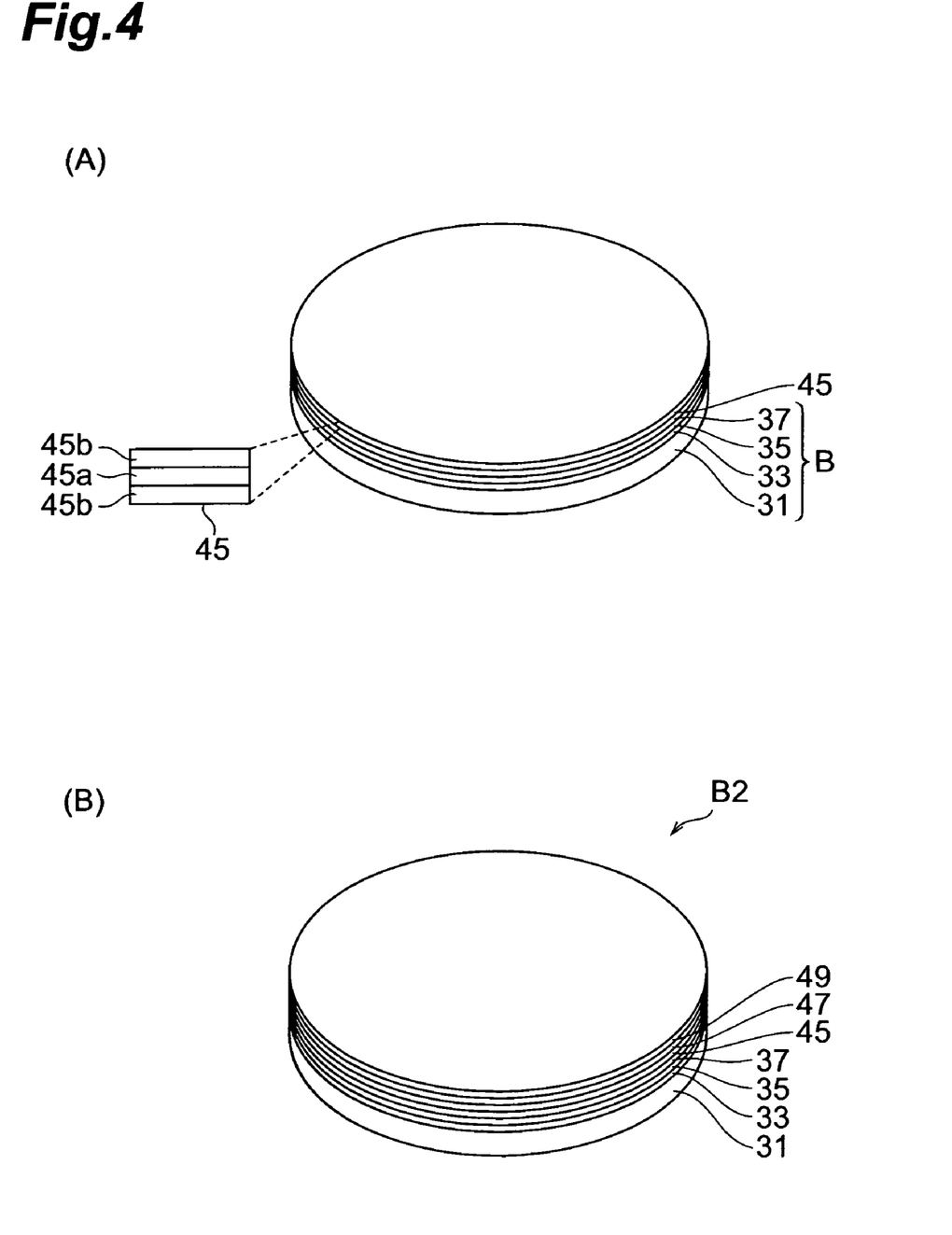
FIG. 4 is a view showing fabrication steps for structure 2.

With reference to Parts (A) and (B) of FIG. 4, a quantum well active region 45 for structure 2 is grown on the epitaxial wafer "B." The quantum well active region 45 includes a well layer 45a and a barrier layer 45b. The well layer 45a is an In$_{X1}$Al$_{Y1}$Ga$_{1-X1-Y1}$N (1>X1>0, 1>Y1>0). The barrier layer 45b is an In$_{X2}$Al$_{Y2}$Ga$_{1-X2-Y2}$N (1>X2>0, 1>Y2>0). The formation temperature of the quantum well active region 45 is higher than the growth temperature of the InAlGaN buffering layer 37. In the present embodiment, the growth of the quantum well active region 45 is performed at the temperature of 830 degrees Celsius. The indium composition X3 of the In$_{X3}$Al$_{Y3}$Ga$_{1-X3-Y3}$N layer is greater than the indium composition X1 of the In$_{X1}$Al$_{Y1}$Ga$_{1-X1-Y1}$N well layer, and the indium composition X3 of the In$_{X3}$Al$_{Y3}$Ga$_{1-X3-Y3}$N layer is greater than the indium composition X2 of the In$_{X2}$Al$_{Y2}$Ga$_{1-X2-Y2}$N barrier layer. The aluminum composition Y1 of the In$_{X1}$Al$_{Y1}$Ga$_{1-X1-Y1}$N well layer is smaller than the aluminum composition Y3 of the In$_{X3}$Al$_{Y3}$Ga$_{1-X3-Y3}$N layer, and the aluminum composition Y2 of the In$_{X2}$Al$_{Y2}$Ga$_{1-X2-Y2}$N barrier layer is smaller than the aluminum composition Y3 of the In$_{X3}$Al$_{Y3}$Ga$_{1-X3-Y3}$N layer. In one example, the composition of the well layer 45a is In$_{0.02}$Al$_{0.09}$Ga$_{0.81}$N and the composition of the barrier layer 45b is In$_{0.02}$Al$_{0.22}$Ga$_{0.76}$N. The thickness of the In$_{0.02}$Al$_{0.09}$Ga$_{0.81}$N well layer is 2.7 nanometers and the thickness of the In$_{0.02}$Al$_{0.22}$Ga$_{0.76}$N barrier layer is 15 nanometers.

As shown in Part (B) of FIG. 4, a p-type AlGaN film 47 is formed using the organo-metallic vapor phase epitaxy furnace. This growth is performed at the temperature of 1030 degrees Celsius, for example. The composition of the p-type AlGaN film 47 is, for example, Al$_{0.27}$Ga$_{0.73}$N and the thickness of the p-type AlGaN film 47 for blocking electrons is, for example, 25 nanometers. Then, a p-type AlGaN film 49 for forming an excellent ohmic contact is grown using the organo-metallic vapor phase epitaxy furnace. This growth is performed at the temperature of 1030 degrees Celsius. The composition of the p-type AlGaN film 49 is, for example, Al$_{0.18}$Ga$_{0.82}$N and the thickness of the p-type AlGaN film 49 is, for example, 60 nanometers. These steps provide an epitaxial wafer "B2."

The epitaxial substrates "B1" and "B2" are analyzed by SIMS method to estimate the oxygen concentrations of the quantum well active layers 39, 45. The oxygen concentrations of the quantum well active layer 39 and buffering layer in the epitaxial substrate "B1" both are about $1\times10^{18}$cm$^{-3}$. The oxygen concentrations of the quantum well active layer 45 and buffering layer in the epitaxial substrate "B2" are about $5\times10^{17}$ cm$^{-3}$ and about $1\times10^{18}$ cm$^{-3}$, respectively. This shows that the oxygen concentration is reduced by increase the growth temperature of AlInGaN. The reduction of oxygen concentrations provides the excellent crystal quality.

Figure 5:
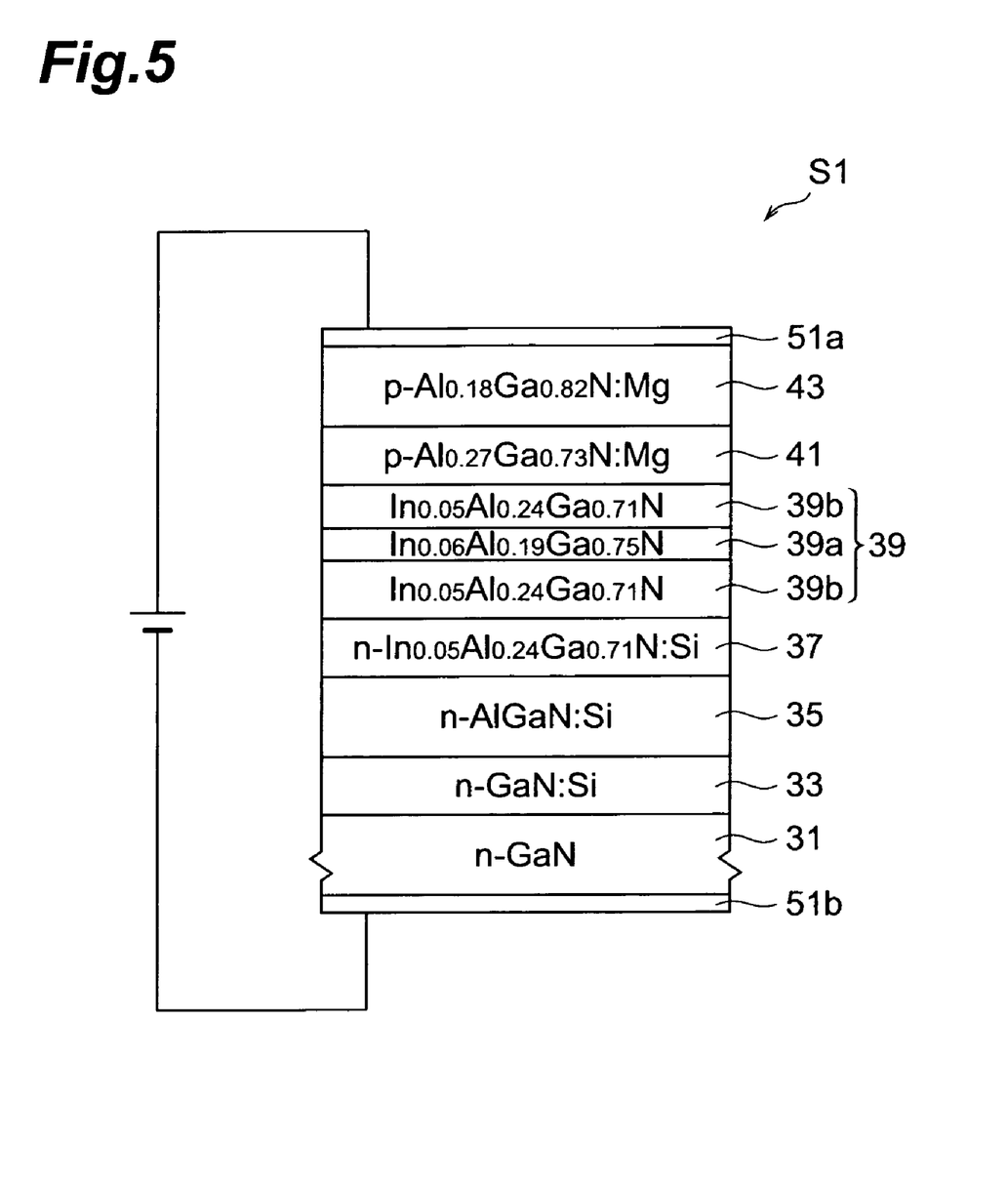
FIG. 5 is a schematic view showing a light emitting diode of the structure 1.
Figure 6:
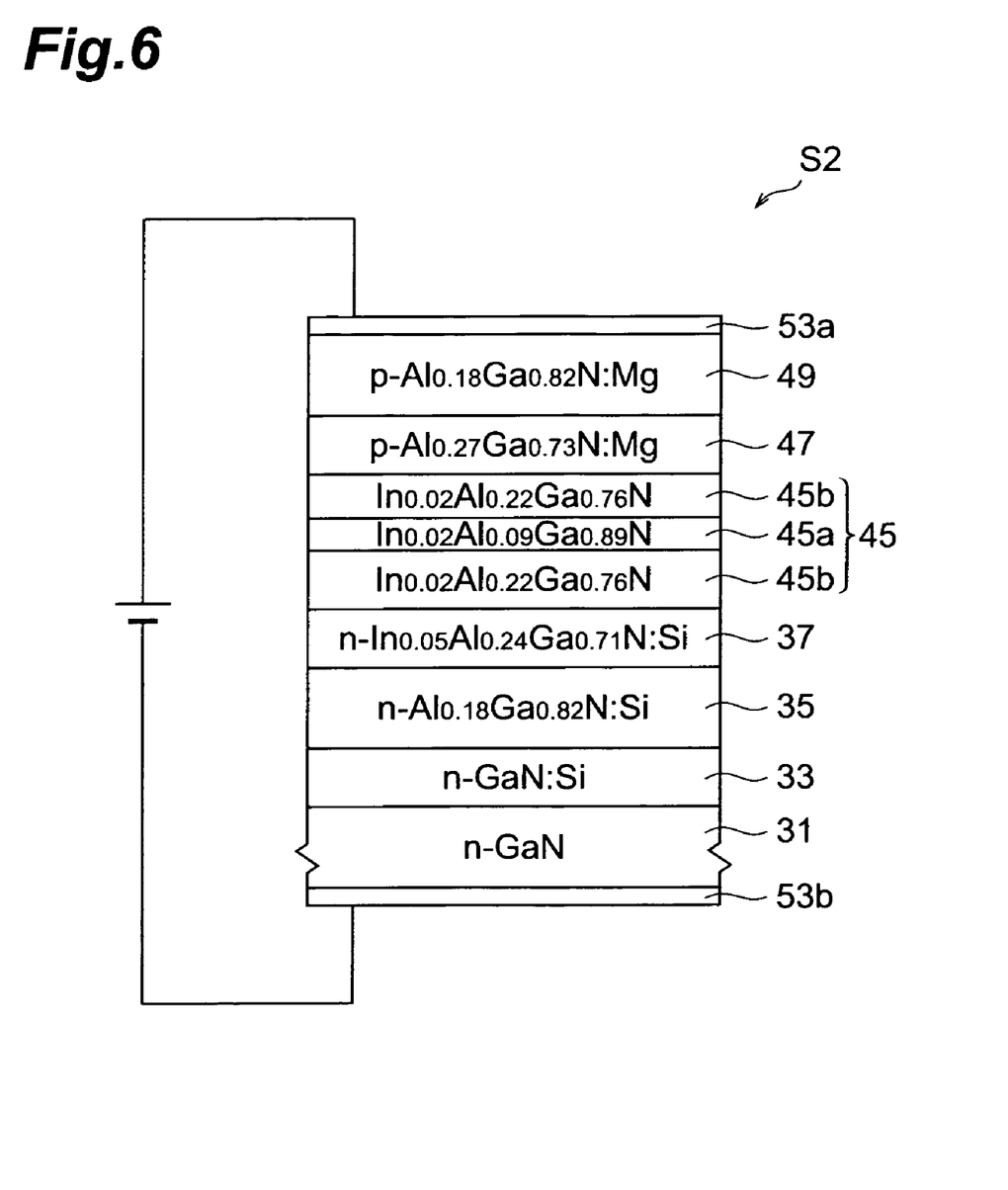
FIG. 6 is a schematic view showing a light emitting diode of the structure 2.

An anode electrode 51a, such as Ni/Au, is formed on the p-type region of the epitaxial wafer B1 and a cathode electrode 51b, such as Ti/Al, is formed on the backside of the GaN substrate in the epitaxial wafer "B1" to form an LED structure "S1" as shown in FIG. 5. An anode electrode 53a, such as Ni/Au, is formed on the p-type region in the epitaxial wafer "B2" and a cathode electrode 53b, such as Ti/Al, is formed on the backside of the GaN substrate in the epitaxial wafer "B2" to form an LED structure "S2" as shown in FIG. 6.

Figure 7:
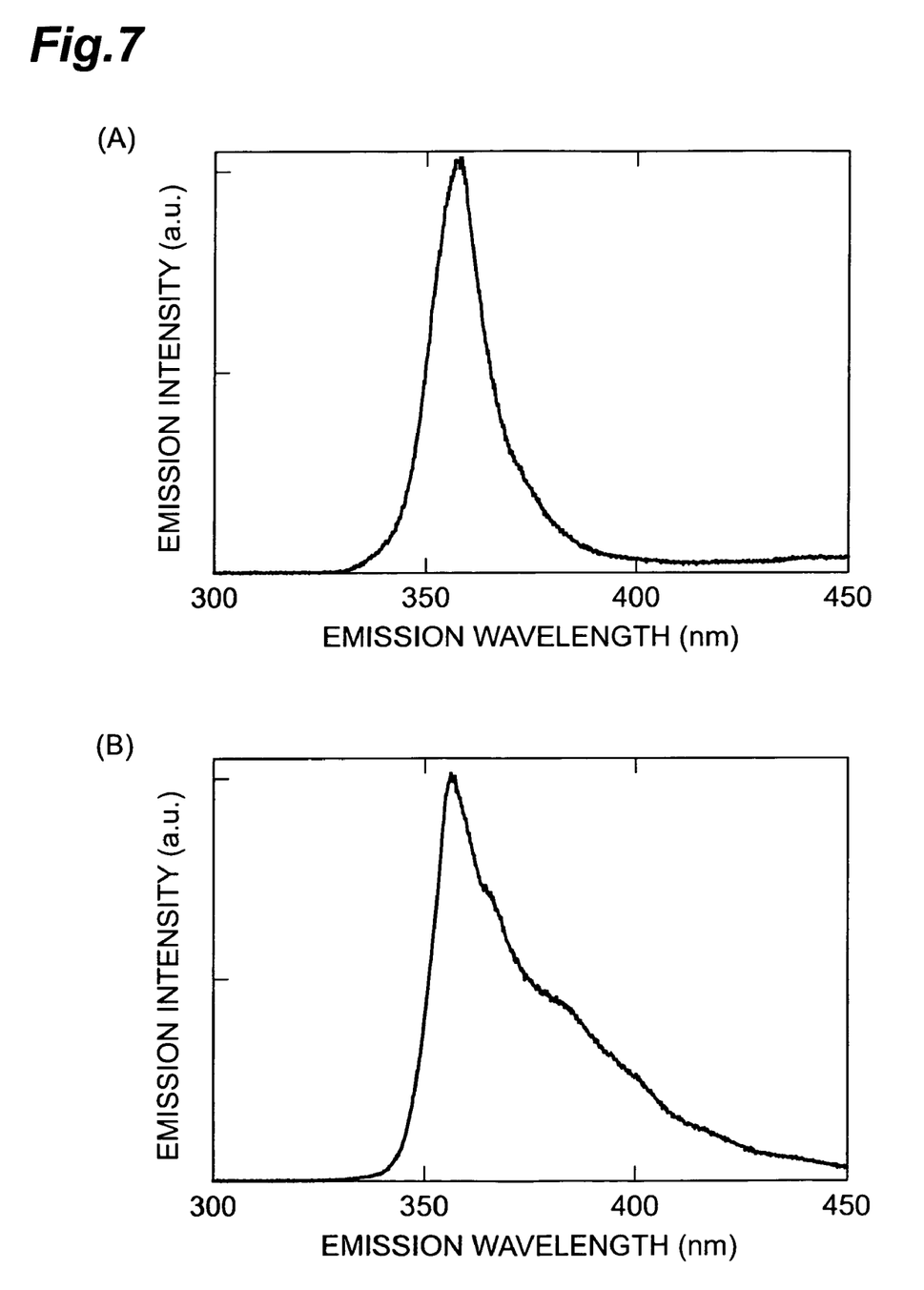
FIG. 7 is a view showing the optical spectrums of the structure 1 measured at the temperatures of 300 K and 210K.
Figure 8:
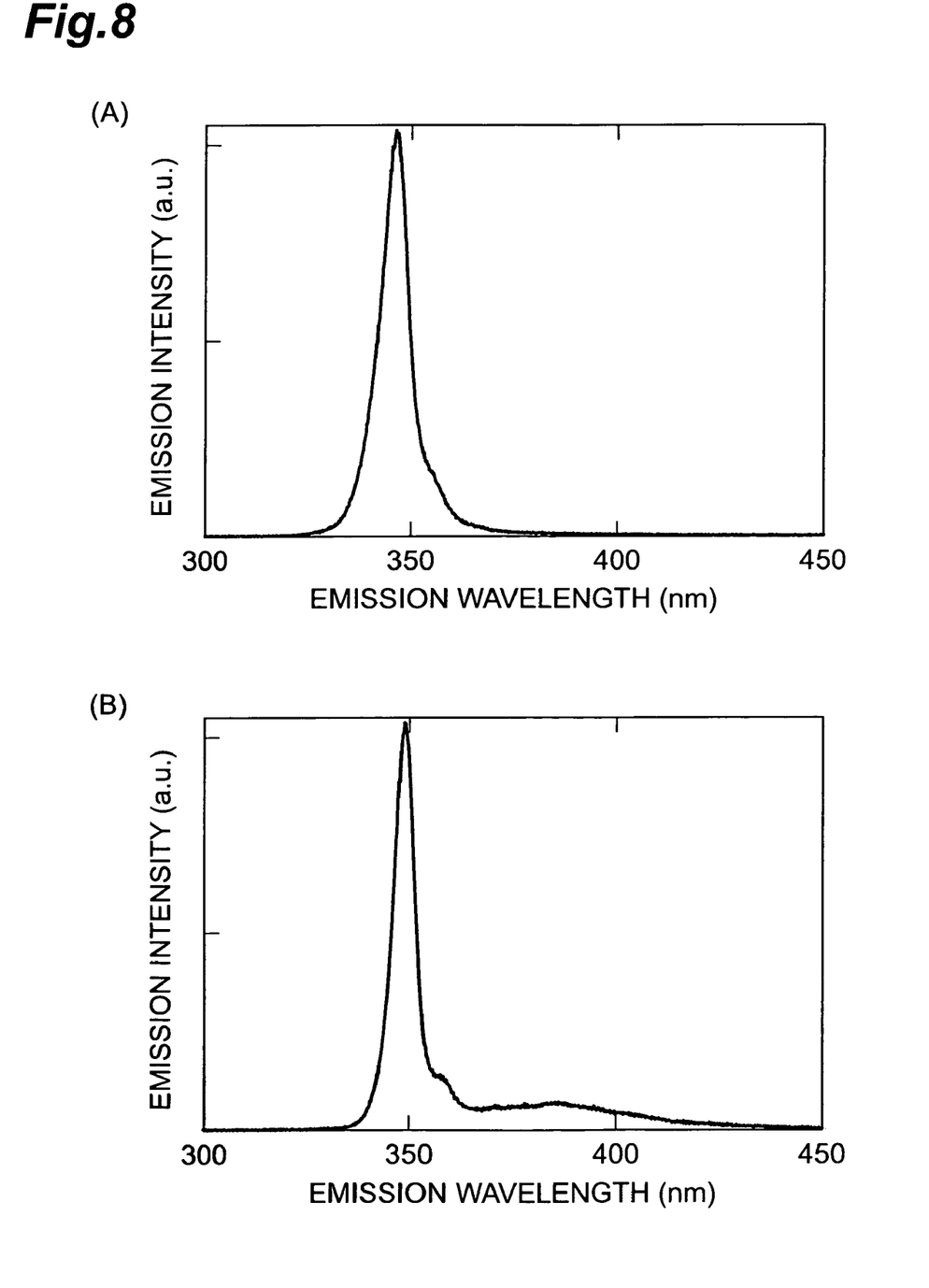
FIG. 8 is a view showing the optical spectrums of the structure 2 measured at the temperatures of 300 K and 210K.

Voltages are applied to these LED structures "S1," "S2" to measure optical power. Parts (A) and (B) of FIG. 7 show emission spectrums of the LED structure "S1." Parts (A) and (B) of FIG. 8 show emission spectrums of the LED structure "S2." The emission spectrums in Parts (A) of FIGS. 7 and 8 are measured at the temperature of 300 Kelvin and the emission spectrums in Parts (B) of FIGS. 7 and 8 are measured at the temperature of 210 Kelvin. Each of the emission spectrums of the LED structures "S1" and "S2" has a single sharp peak. But, the emission spectrum of the LED structure "S1" has an additional board signal indicating another emission in wavelength region longer than the peak wavelength at the temperature of 210 Kelvin.

Figure 9:
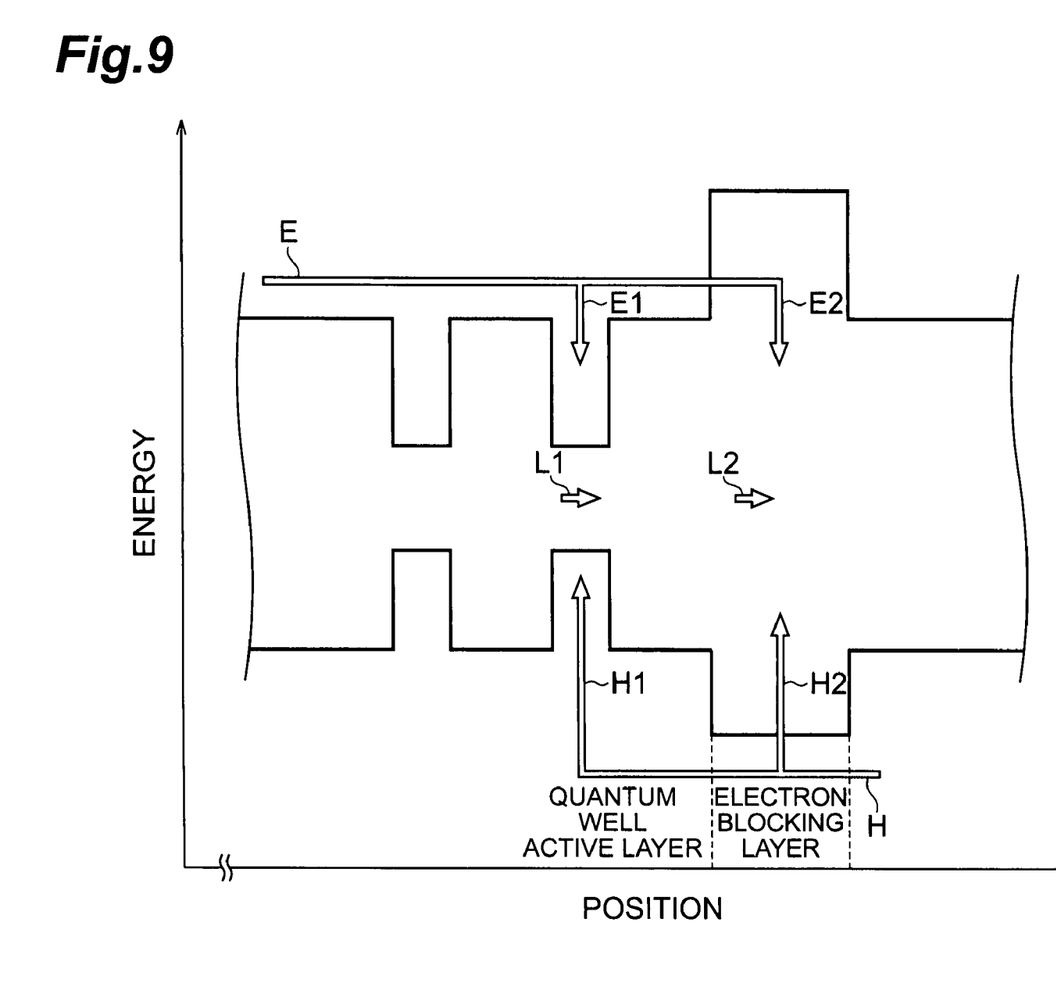
FIG. 9 is a view showing a band diagram of the structure 1.

It is thought that the above board signal in the emission spectrum of the LED structure "S1" comes from emission by the p-type AlGaN region. The efficiency of this emission is not strong at room temperature. But, as the temperature is lowered, this emission efficiency becomes high and the electrical characteristics of the p-type AlGaN region are deteriorated, thereby causing the leakage of electron from the quantum well active region. The emission from the leakage of electron appears in the emission spectrum of the LED structure "S1." The emission spectrum of the LED structure "S2" does not have any board signal as above. That is, as shown in FIG. 9, the leakage "E1" of electron is increased in the quantum well active layer having a high oxygen concentration, and this deteriorates the injection efficiency because oxygen acts as donor in the gallium nitride based semiconductor. The recombination of electrons "E1" and holes "H1" in the quantum well active layer generates light having a wavelength component of 350 nanometers (ultraviolet light). The recombination of electrons E2 and holes H2 in the quantum well active layer generates light having a wavelength component of 390 nanometers. This emission relates to deep acceptor level form magnesium (Mg) and appears as a board signal in the emission spectrum around 390 nanometers.

The peak intensity of the LED structure "S2" is twice as high as that of the LED structure "S1." This comes from the following:
(1) When the growth temperatures of the well and barrier layers are raised, abruptness of the interface between the well and barrier layers becomes excellent.
(2) When the growth temperatures of the well and barrier layers are raised, the quantity of oxygen taken therein is reduced, thereby improving the crystal quality of the quantum well active layer.
(3) When the oxygen concentration is small, the carrier injection efficiency is improved.

Therefore, most of electrons E are recombined with holes H in the quantum well active layer and thus the intensity of light (ultraviolet) having a wavelength component of 350 nm becomes strong. Accordingly, The quantity of holes "H" and electrons "E" recombined in the p-type AlGaN region becomes small.

Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims.

What is claimed is:

1. A nitride semiconductor light generating device comprising:
    an n-type gallium nitride based semiconductor layer;
    a quantum well active layer including an $In_{X1}Al_{Y1}Ga_{1-X1-Y1}N$ (1>X1>0, 1>Y1>0) well layer and an $In_{X2}Al_{Y2}Ga_{1-X2-Y2}N$ (1>X2>0, 1>Y2>0) barrier layer;
    an $In_{X3}Al_{Y3}Ga_{1-X3-Y3}N$ (1>X3>0, 1>Y3>0) layer provided between the quantum well active layer and the n-type gallium nitride based semiconductor layer, an indium composition X3 of the $In_{X3}Al_{Y3}Ga_{1-X3-Y3}N$ layer being greater than an indium composition X1 of the $In_{X1}Al_{Y1}Ga_{1-X1-Y1}N$ well layer, an indium composition X3 of the $In_{X3}Al_{Y3}Ga_{1-X3-Y3}N$ layer being greater than an indium composition X2 of the $In_{X2}Al_{Y2}Ga_{1-X2-Y2}N$ barrier layer, an aluminum composition Y1 of the $In_{X1}Al_{Y1}Ga_{1-X1-Y1}N$ well layer being smaller than an aluminum composition Y3 of the $In_{X3}Al_{Y3}Ga_{1-X3-Y3}N$ layer, an aluminum composition Y2 of the $In_{X2}Al_{Y2}Ga_{1-X2-Y2}N$ barrier layer being smaller than an aluminum composition Y3 of the $In_{X3}Al_{Y3}Ga_{1-X3-Y3}N$ layer, and an oxygen concentration of the quantum well active layer being lower than that of the $In_{X3}Al_{Y3}Ga_{1-X3-Y3}N$ layer; and a p-type AlGaN layer having a bandgap energy greater than that of the $In_{X2}Al_{Y2}Ga_{1-X2-Y2}N$ barrier layer, the quantum well active layer being provided between the p-type AlGaN layer and the $In_{X3}Al_{Y3}Ga_{1-X3-Y3}N$ layer,
    wherein an oxygen concentration of the $In_{X3}Al_{Y3}Ga_{1-X3-Y3}N$ layer is greater than or equal to $1\times10^{18}$ cm$^{-3}$ and lower than or equal to $1\times10^{20}$ cm$^{-3}$.

2. The nitride semiconductor light generating device according to claim 1, wherein an oxygen concentration of the quantum well active layer is lower than $1\times10^{18}$ cm$^{-3}$.

3. The nitride semiconductor light generating device according to claim 1, wherein an oxygen concentration of the quantum well active layer is greater than or equal to $1\times10^{16}$ cm$^{-3}$.

4. The nitride semiconductor light generating device according to claim 1, further comprising a group III nitride substrate, the n-type gallium nitride based semiconductor layer being provided between the $In_{X3}Al_{Y3}Ga_{1-X3-Y3}N$ layer and the group III nitride substrate.

5. The nitride semiconductor light generating device according to claim 4, wherein the group III nitride substrate includes a gallium nitride substrate.

* * * * *